(12) United States Patent
Korolik et al.

(10) Patent No.: US 9,449,843 B1
(45) Date of Patent: Sep. 20, 2016

(54) SELECTIVELY ETCHING METALS AND METAL NITRIDES CONFORMALLY

(71) Applicant: Applied Materials, Inc., Santa Clara, CA (US)

(72) Inventors: Mikhail Korolik, San Jose, CA (US); Nitin K. Ingle, San Jose, CA (US); David Thompson, San Jose, CA (US); Jeffrey W. Anthis, San Jose, CA (US); David Knapp, Santa Clara, CA (US); Benjamin Schmiege, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 14/734,222

(22) Filed: Jun. 9, 2015

(51) Int. Cl.
*H01L 21/3213* (2006.01)

(52) U.S. Cl.
CPC .............................. *H01L 21/32135* (2013.01)

(58) Field of Classification Search
None
See application file for complete search history.

(56) References Cited

U.S. PATENT DOCUMENTS

| | | | |
|---|---|---|---|
| 8,211,808 B2 | 7/2012 | Sapre et al. | |
| 8,435,902 B2 | 5/2013 | Tang et al. | |
| 8,642,481 B2 | 2/2014 | Wang et al. | |
| 9,130,158 B1* | 9/2015 | Shen | H01L 43/12 |
| 9,330,936 B2* | 5/2016 | Hasegawa | H01L 21/32051 |
| 2006/0019493 A1* | 1/2006 | Li | H01L 21/76823 438/680 |
| 2009/0104782 A1 | 4/2009 | Lu et al. | |
| 2011/0053380 A1 | 3/2011 | Sapre et al. | |
| 2011/0266252 A1 | 11/2011 | Thadani | |
| 2011/0294300 A1 | 12/2011 | Zhang et al. | |
| 2012/0211462 A1 | 8/2012 | Zhang et al. | |
| 2013/0052827 A1 | 2/2013 | Wang et al. | |
| 2013/0059440 A1 | 3/2013 | Wang et al. | |
| 2014/0251953 A1 | 9/2014 | Winkler | |
| 2014/0251954 A1 | 9/2014 | Winkler | |
| 2014/0308816 A1 | 10/2014 | Wang et al. | |
| 2015/0126040 A1* | 5/2015 | Korolik | H01L 21/3065 438/718 |
| 2015/0129546 A1 | 5/2015 | Ingle et al. | |
| 2015/0132939 A1* | 5/2015 | Hasegawa | H01L 21/02381 438/602 |
| 2015/0170935 A1 | 6/2015 | Wang et al. | |
| 2015/0206764 A1 | 7/2015 | Wang et al. | |
| 2015/0262829 A1 | 9/2015 | Park et al. | |
| 2015/0345028 A1* | 12/2015 | Wang | C23F 1/12 216/67 |
| 2016/0118268 A1* | 4/2016 | Ingle | H01L 21/32136 438/705 |

FOREIGN PATENT DOCUMENTS

| | | |
|---|---|---|
| CN | 102820224 A | 12/2012 |
| CN | 103681242 A | 3/2014 |
| CN | 104018157 A | 9/2014 |

* cited by examiner

*Primary Examiner* — Allan Olsen
(74) *Attorney, Agent, or Firm* — Kilpatrick Townsend & Stockton LLP (57) ABSTRACT

Methods of selectively etching metals and metal nitrides from the surface of a substrate are described. The etch selectively removes metals and metal nitrides relative to silicon-containing layers such as silicon, polysilicon, silicon oxide, silicon germanium, silicon carbide, silicon carbon nitride and/or silicon nitride. The etch removes material in a conformal manner by including an oxidation operation which creates a thin uniform metal oxide. The thin uniform metal oxide is then removed by exposing the metal oxide to a metal-halogen precursor in a substrate processing region. The metal oxide may be removed to completion and the etch may stop once the uniform metal oxide layer is removed. Etches described herein may be used to uniformly trim back material on high aspect ratio features which ordinarily show higher etch rates near the opening of a gap compared to deep within the gap.

15 Claims, 6 Drawing Sheets

SELECTIVELY ETCHING METALS AND METAL NITRIDES CONFORMALLY

FIELD

The embodiments described herein relate to selectively removing metal-containing material.

BACKGROUND

Integrated circuits are made possible by processes which produce intricately patterned material layers on substrate surfaces. Producing patterned material on a substrate requires controlled methods for removal of exposed material. Chemical etching is used for a variety of purposes including transferring a pattern in photoresist into underlying layers, thinning layers or thinning lateral dimensions of features already present on the surface. Often it is desirable to have an etch process which etches one material faster than another helping e.g. a pattern transfer process proceed. Such an etch process is said to be selective of the first material. As a result of the diversity of materials, circuits and processes, etch processes have been developed that selectively remove one or more of a broad range of materials.

Dry etch processes are often desirable for selectively removing material from semiconductor substrates. The desirability stems from the ability to gently remove material from miniature structures with minimal physical disturbance. Dry etch processes also allow the etch rate to be abruptly stopped by removing the gas phase reagents. Some dry-etch processes involve the exposure of a substrate to remote plasma by-products formed from one or more precursors. Many dry etch processes have recently been developed to selectively remove a variety of dielectrics relative to one another. However, relatively few dry-etch processes have been developed to selectively remove metal-containing material. Methods are needed to broaden the process sequences to various metal-containing materials.

SUMMARY

Methods of selectively etching metals and metal nitrides from the surface of a substrate are described. The etch selectively removes metals and metal nitrides relative to silicon-containing layers such as silicon, polysilicon, silicon oxide, silicon germanium, silicon carbide, silicon carbon nitride and/or silicon nitride. The etch removes material in a conformal manner by including an oxidation operation to form a thin uniform metal oxide which is then removed by exposing the metal oxide to a metal-halogen precursor in a substrate processing region. The metal oxide may be removed to completion and the etch may stop once the uniform metal oxide layer is removed leaving behind an unoxidized portion of either the metal or metal nitride. Etches described herein may be used to uniformly trim back material on high aspect ratio features which ordinarily show different etch rates near the opening of a gap compared to deep within the gap. No plasma excites the metal-halogen precursor either remotely or locally in embodiments.

Embodiments described herein include methods of etching a metal layer. The methods include placing a patterned substrate into a substrate processing region of a substrate processing chamber. The patterned substrate includes an exposed portion of the metal layer. The metal layer includes a first metal element. The methods further include flowing an oxygen-containing precursor into the substrate processing region. The methods further include oxidizing the exposed portion of the metal layer. Oxidizing the exposed portion leaves an oxidized portion of the metal layer and an unoxidized portion of the metal layer. The methods further include flowing a metal-and-halogen-containing precursor into the substrate processing region. The methods further include selectively etching the oxidized portion of the metal layer. The metal-and-halogen-containing precursor includes a second metal element and a halogen.

The metal layer may consist only of the first metal element and the first metal element may be one of titanium, hafnium, zirconium, vanadium, niobium, tantalum, chromium, molybdenum, tungsten, manganese, rhenium, technetium, iron, aluminum, gallium.

Embodiments described herein include methods of etching a metal-and-nitrogen-containing layer. The methods include placing a patterned substrate into a substrate processing region of a substrate processing chamber. The patterned substrate includes an exposed portion of the metal-and-nitrogen-containing layer. The metal layer includes a first metal element and nitrogen. The methods further include flowing an oxygen-containing precursor into the substrate processing region. The methods further include oxidizing the exposed portion of the metal-and-nitrogen-containing layer. Oxidizing the exposed portion leaves behind an oxidized portion of the metal-and-nitrogen-containing layer and an unoxidized portion of the metal-and-nitrogen-containing layer. The methods further include flowing a metal-and-halogen-containing precursor into the substrate processing region. The methods further include selectively etching the oxidized portion of the metal-and-nitrogen-containing layer. The metal-and-halogen-containing precursor includes a second metal element and a halogen.

Embodiments described herein include methods of etching a metal-containing layer. The methods include placing a patterned substrate into a substrate processing region of a substrate processing chamber. The patterned substrate includes an exposed portion of the metal-containing layer as well as exposed regions of a silicon-containing material. The metal-containing layer includes a first metal element. The method further includes removing a cycle thickness of the metal-containing layer with a processing cycle of: i) flowing an oxygen-containing precursor into the substrate processing region and oxidizing the exposed portion of the metal-containing layer, wherein oxidizing the exposed portion creates an oxidized portion of the metal-containing layer and an unoxidized portion of the metal-containing layer; and ii) flowing a metal-and-halogen-containing precursor into the substrate processing region, removing the oxidized portion of the metal-containing layer and leaving the remaining portion of the metal-containing layer intact, wherein the metal-and-halogen-containing precursor comprises a second metal element and a halogen.

The operation of removing the oxidized portion of the metal-containing layer may etche the oxidized portion of the metal-containing layer at over one hundred times as fast as the operation etches the unoxidized portion. Operations i) and ii) are repeated N times to remove a thickness of (N+1) times the cycle thickness. The substrate processing region may be plasma-free during the operation of flowing the metal-and-halogen-containing precursor into the substrate processing region. The metal-containing layer may include only the first metal element. The metal-containing layer may include only the first metal element and nitrogen. The oxygen-containing precursor may include one or more of O, $O_2$, $O_3$, $N_2O$, $NO_2$, NO or $SO_3$. The first metal element may have an atomic number of 22-24, 40-42, 72-73 or 74. The second metal element may have an atomic number of 22-24, 40-42, 72-73 or 74. The metal-and-halogen-containing precursor may include only the second metal element and the halogen. The halogen may include one of Cl, F, Br or I. The silicon-containing material may be one of silicon, polysilicon, silicon oxide, silicon germanium or silicon nitride.

Additional embodiments and features are set forth in part in the description that follows, and in part will become apparent to those skilled in the art upon examination of the specification or may be learned by the practice of the disclosed embodiments. The features and advantages of the disclosed embodiments may be realized and attained by means of the instrumentalities, combinations, and methods described in the specification.

DESCRIPTION OF THE DRAWINGS

A further understanding of the nature and advantages of the disclosed embodiments may be realized by reference to the remaining portions of the specification and the drawings.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Methods of selectively etching metals and metal nitrides from the surface of a substrate are described. The etch selectively removes metals and metal nitrides relative to silicon-containing layers such as silicon, polysilicon, silicon oxide, silicon germanium, silicon carbide, silicon carbon nitride and/or silicon nitride. The etch removes material in a conformal manner by including an oxidation operation to form a thin uniform metal oxide which is then removed by exposing the metal oxide to a metal-halogen precursor in a substrate processing region. The metal oxide may be removed to completion and the etch may stop once the uniform metal oxide layer is removed. Etches described herein may be used to uniformly trim back material on high aspect ratio features which ordinarily show different etch rates near the opening of a gap compared to deep within the gap. No plasma excites the metal-halogen precursor either remotely or locally in embodiments.

Figure 1:
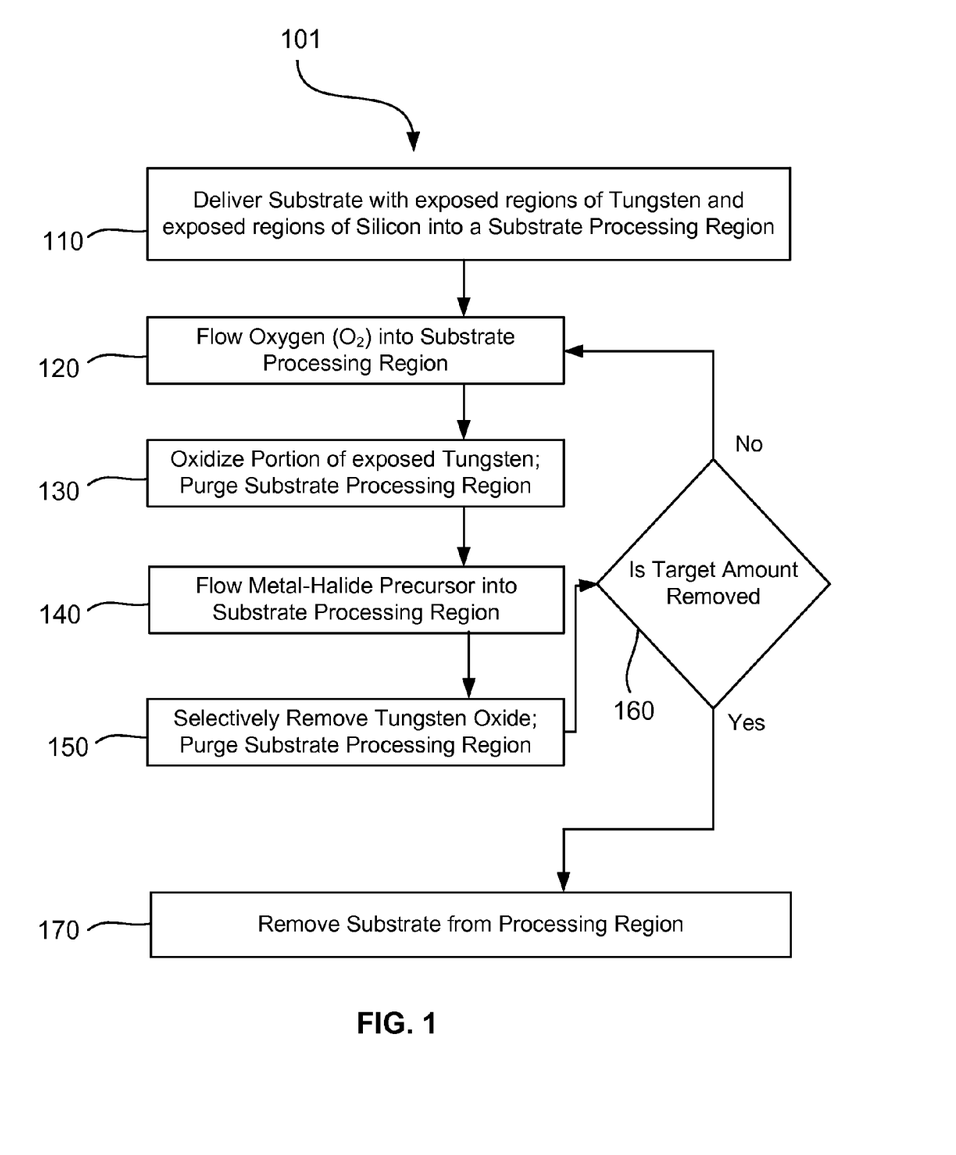
FIG. 1 is a flow chart of a tungsten selective etch process according to embodiments.

To better understand and appreciate the embodiments described herein, reference is now made to FIG. 1 which is a flow chart of a tungsten selective etch process 101 according to embodiments. The tungsten forms exposed surfaces of the surface of a patterned substrate. There may also be exposed portions of silicon on the patterned substrate. The patterned substrate is then delivered into a substrate processing region (operation 110).

A flow of $O_2$ is introduced into the substrate processing region (operation 120). Other sources of oxygen may be used to augment or replace the $O_2$. In general, an oxygen-containing precursor may be flowed into the substrate processing region in embodiments. The oxygen-containing precursor may include one or more of O, $O_2$, $O_3$, $H_2O$, $N_2O$, $NO_2$, NO, $H_2O_2$, an organic peroxide, and $SO_3$ in embodiments. The exposed portion of tungsten is oxidized (operation 130) by exposure to the oxygen-containing precursor to form a layer of tungsten oxide. Operation 130 may proceed to a certain thickness after which further exposure does not increase the thickness of the tungsten oxide layer. This trait lends itself to forming a uniform oxidation layer (in this case a uniform tungsten oxide layer). The oxygen-containing precursor or patterned substrate temperature may be selected to adjust the thickness of the tungsten oxide layer. More aggressive oxidizers than $O_2$ may be used to increase the thickness of the tungsten oxide layer and less aggressive oxidizers than $O_2$ may be used to decrease the thickness of the tungsten oxide layer as desirable for a given application. The oxygen-containing precursor may include a weaker oxidizer including one or more of $N_2O$ and NO according to embodiments. The oxygen-containing precursor may include a stronger oxidizer including one or more of $NO_2$, O, $O_3$ and $SO_3$ in embodiments. As described in more detail later, the oxygen-containing precursor and/or the substrate processing region may be hydrogen-free, devoid of O—H groups, carbon-free and/or fluorine-free, according to embodiments. The substrate processing region is purged to remove the oxygen-containing precursor in operation 130.

Generally speaking, metals oxidized and processed herein may include one or more of titanium, hafnium, zirconium, vanadium, niobium, tantalum, chromium, molybdenum, tungsten, manganese, rhenium, technetium, iron, aluminum and gallium in embodiments. The metal layer may comprise or consist of a metal element in embodiments. The metal element may have an atomic number of 22, 23, 24, 40, 41, 42, 72, 73 or 74 according to embodiments. The metal element may be from one of group 4, group 5 or group 6 of the periodic table, in embodiments, or may be a transition metal.

A metal-and-halogen-containing precursor (e.g. $WCl_6$) is then flowed into the substrate processing region in operation 140 to react with the tungsten oxide. The metal-and-halogen-containing precursor may be referred to herein equivalently as a metal-halide precursor and contains a metal element to be defined herein and a halogen. The metal-and-halogen-containing precursor comprises and may consist only of the metal element and a halogen. Metal films oxidized according to the embodiments described herein have been found to react with the metal-halide precursors exothermically and no plasma is present in the substrate processing region in embodiments. No plasma excites the metal-halide precursor prior to entering the substrate processing region according to embodiments.

A potential chemical model for the reactions which are taking place on the surface may be instructive but shall not be construed to narrow claim coverage since models nearly always deviate from reality in some way or another. During operation 120 and 130, solid tungsten (W) may be reacting with ($O_2$) to form tungsten oxide which may take the form of $WO_3$. Operations 140 and 150 may expose $WO_3$ to $WCl_6$ (or possibly $WCl_5$) to form volatile $WOCl_4$ which leaves the surface until all tungsten oxide is removed. The reaction naturally stops once the tungsten oxide portion (or metal oxide portion in general) is removed. The process (120-150, and 220-250 later) can be repeated an integral number of cycles. Each cycle may remove a selectable amount of the original tungsten film (e.g. 1 or 2 monolayers). A benefit of the chemical reaction combination is the extremely high conformality achieved by combining a very conformal oxidation reaction with an etching reaction which stops after the tungsten oxide (or metal oxide generally) is depleted. These hypothetical reactions also apply to later examples involving tungsten nitride and the hypothetical chemical reactions will not be repeated during that discussion. Process effluents (unreacted etchants, reacted etchants/etch by-products, inert species) may be actively purged or simply exhausted from the substrate processing region in operation 150. Decision 160 results in either repeating operations 120-150 if additional material is to be removed or else the substrate is removed from the substrate processing region (operation 170).

The metal oxide may comprise or consist of a metal element and oxygen. The oxygen-containing precursor used to oxidize the metal layer may or may not be excited in a plasma during operations 120 and 130 according to embodiments. Plasma excitation of the oxygen-containing precursor may make the precursor oxidize the metal layer more aggressively and increase the thickness of the oxidation layer. During operations 120 and 130, the substrate processing region may be plasma-free or may contain a local plasma excitation using the exemplary hardware described elsewhere herein. A remote plasma may also be used alone or in combination with the local plasma to excite the oxygen-containing precursor in embodiments.

Figure 2:
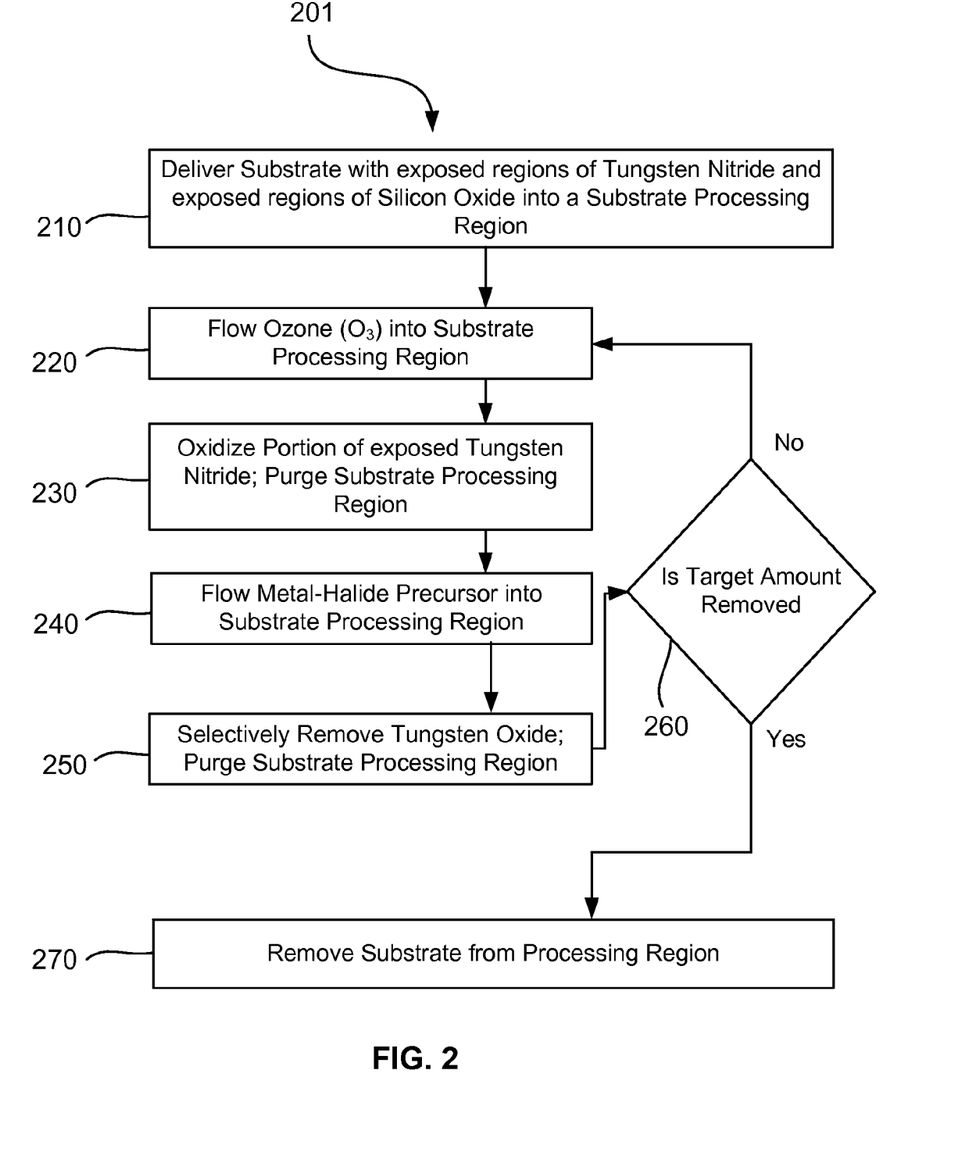
FIG. 2 is a flow chart of a tungsten nitride selective etch process according to embodiments.

A benefit of the etch processes described herein is the exceedingly conformal removal rate. Deep gaps, trenches or vias often exhibit a higher removal rate near their opening relative to portions deep within a trench. High aspect ratio features which are very deep and or very narrow at the opening may be conformally etched with extraordinary uniformity using the methods presented herein. For example, some DRAM cells may have cells which require a hole or "via" which is several microns deep but only tens of nanometers wide at the mouth. The methods described herein may be used to remove metals (and metal nitrides in the next example) at a uniform thickness of between 0.5 nm and 20 nm, between 1 nm and 10 nm or between 2 nm and 5 nm according to embodiments. Higher etch amounts within these ranges may benefit from applying a plurality of cycles of operations 120-150 (or 220-250 in the next example). Each cycle may remove metals and metal nitrides at a uniform thickness of between 0.1 nm and 2 nm or between 0.2 nm and 1 nm according to embodiments. A cycle may be repeated an integral number of times, for example over ten times, over twenty times, over fifty times or over one hundred times according to embodiments. The etch rate at near the bottom of a high aspect ratio feature may be within 12%, within 7%, within 5% or within 3% of the etch rate near the opening of the high aspect ratio feature in embodiments. The depth of a via or trench (high aspect ratio features) may be greater than 0.5 µm, greater than 1.0 µm or greater than 2.0 µm according to embodiments. The width of via or trench (in the narrower dimension) may be less than 30 nm, less than 20 nm or less than 10 nm in embodiments. The depth-to-width aspect ratio may be greater than ten, greater than fifty or greater than one hundred according to embodiments.

Generally speaking, the metal-and-halogen-containing precursor may include two or more or only two elements including a metal element and a halogen element. The metal-and-halogen-containing precursor may include only a single atom of the metal element but multiple atoms of the halogen element (as is the case for $WCl_6$ and $WCl_5$) to make vaporization easier and to promote the volatility of the reaction product on the metal surface. The metal element may include one or more of titanium, hafnium, zirconium, vanadium, niobium, tantalum, chromium, molybdenum, tungsten, manganese, rhenium, technetium, iron, aluminum and gallium in embodiments. The metal element may have an atomic number of 22, 23, 24, 40, 41, 42, 72, 73 or 74 according to embodiments. The metal element may be from one of group 4, group 5 or group 6 of the periodic table, in embodiments, or may be transition metals. The halogen element may be one of F and Cl according to embodiments. The halogen element may be one of F, Cl, Br and I in embodiments. Some examples of metal-and-halogen-containing precursors include vanadium pentahalides, tantalum pentahalides, chromium pentahalides, molybdenum pentahalides, molybdenum hexahalides, niobium pentahalides, tungsten pentahalides, tungsten hexahalides, and manganese tetrahalides according to embodiments. All these characteristics for the metal-and-halogen-containing precursor apply to etch process 201 and will not be repeated in the associated description.

The metal layer may comprise or consist of a first metal element while the metal-and-halogen-containing precursor may comprise or consist of a second metal element and a halogen. The first metal element and the second metal element may be the same as in the example of FIG. 1. The metal film in the example was tungsten (W) and the metal-and-halogen-containing precursor was $WCl_6$. Put another way, the first metal element and the second metal element may have an identical atomic number. However, the first metal element and the second metal element may differ. The atomic number of the first metal element may not be equal to the atomic number of the second metal element according to embodiments. For example, niobium chloride may etch an oxidized layer of titanium. The permutations of viable reactions are too numerous to list but can be arrived by combining the metals listed for the metal-and-halogen-containing precursor and the metals listed for the metal layer. All characterizations described herein apply to metal layers as well as metal nitride layers to be described shortly.

Reference is now made to FIG. 2 which is a flow chart of a tungsten nitride selective etch process 201 according to embodiments. Exposed tungsten nitride portions are present on a patterned substrate. There may also be exposed portions of silicon oxide on the patterned substrate. The patterned substrate is delivered into a substrate processing region (operation 210). A flow of $O_3$ is introduced into the substrate processing region (operation 220). Just as in etch process 101, other sources of oxygen may be used to augment or replace the $O_3$. Suitable oxygen-containing precursors were listed previously and will not be repeated here. The exposed portion of tungsten nitride is oxidized (operation 230) by exposure to the oxygen-containing precursor to form a layer of tungsten oxide. Operation 230 may proceed in a very conformal manner as in etch process 101 as well. The substrate processing region is evacuated to remove the oxygen-containing precursor in operation 230.

Generally speaking, metal nitrides oxidized and processed herein may include one or more of titanium nitride, hafnium nitride, zirconium nitride, vanadium nitride, niobium nitride, tantalum nitride, chromium nitride, molybdenum nitride, tungsten nitride, manganese nitride, rhenium nitride, technetium nitride, iron nitride, aluminum nitride and gallium nitride in embodiments. The metal nitride layer may comprise or consist of a metal element and nitrogen in embodiments. The metal element may have an atomic number of 22, 23, 24, 40, 41, 42, 72, 73 or 74 according to embodiments. The metal element may be from one of group 4, group 5 or group 6 of the periodic table, in embodiments, or may be a transition metal.

A metal-and-halogen-containing precursor (e.g. $WCl_6$) is then flowed into the substrate processing region in operation 240 to react with the tungsten oxide. The metal-and-halogen-containing precursor may be referred to herein equivalently as a metal-halide precursor and contains a metal element to be defined herein and a halogen. The metal-and-halogen-containing precursor comprises and may consist only of the metal element and a halogen. Metal nitride films oxidized according to the embodiments described herein have been found to react with the metal-halide precursors exothermically and no plasma is present in the substrate processing region in embodiments. No plasma excites the metal-halide precursor prior to entering the substrate processing region according to embodiments. A hypothetical chemical model for the reaction was given previously and applies similarly to operations 220-250 with the one exception being that the starting material is tungsten nitride rather than tungsten. Process effluents (unreacted etchants, reacted etchants/etch by-products, inert species) may be actively purged or simply exhausted from the substrate processing region in operation 250. Decision 260 results in either repeating operations 220-250 if additional material is to be removed or else the substrate is removed from the substrate processing region (operation 270).

The patterned substrate temperature may be held at a temperature appropriate for the material of the metal layer and the metal-halide precursor. Generally speaking, higher temperatures may result in an oxidation operation which proceeds indefinitely and is therefore harder to control than an oxidation which naturally stops or slows after a given thickness in embodiments. The tungsten layer oxidation was found to stop or significantly slow at 350° C. but proceeded indefinitely at 480° C. Each cycle at 350° C. removed about 1A of material. A metal layer oxidation may be referred to as "self-limiting" if the process stops despite continuing exposure to an oxygen-containing precursor. The patterned substrate temperatures described next apply to all the embodiments herein. The substrate temperature may be between 30° C. and 800° C., between 200° C. and 600° C., between 200° C. and 450° C., between 250° C. and 500° C., or between 300° C. and 400° C. according to embodiments. These temperatures may apply to operation 130, operation 230, operations 120-130, operations 220-230, operations 120-150 and operations 220-250 in embodiments.

The etch processes 101 and 201 possess etch selectivities of metal and metal nitride materials relative to a variety of other materials. The metal or metal nitride material may be selectively etched relative to a silicon-containing layer which may also be present as exposed regions on the substrate. The etch selectivity of a metal or metal nitride relative to silicon (including single crystal, polysilicon or amorphous silicon) may be greater than or about 10:1, greater than or about 15:1, greater than or about 20:1 or greater than or about 25:1 in embodiments. The etch selectivity of a metal or metal nitride relative to silicon carbide, silicon carbon nitride or silicon nitride may be greater than or about 15:1, greater than or about 20:1, greater than or about 25:1 or greater than or about 30:1 in embodiments. The etch selectivity of a metal or metal nitride relative to silicon oxide may be greater than or about 20:1, greater than or about 25:1, greater than or about 30:1 or greater than or about 50:1 in embodiments. The etch selectivity of a metal or metal nitride relative to silicon germanium may be greater than or about 20:1, greater than or about 25:1, greater than or about 30:1 or greater than or about 50:1 in embodiments.

Absence (or reduction in magnitude) of any local plasma is desirable to make etch processes more selective, delicate and isotropic. The term "plasma-free" will be used herein to describe the substrate processing region during application of no or essentially no plasma power to the substrate processing region. The etchants (the metal-and-halogen-containing precursor) described possess energetically favorable etch reaction pathways which enable the substrate processing region to be plasma-free during operations of etching metal-containing materials herein. Stated another way, the electron temperature in the substrate processing region may be less than 0.5 eV, less than 0.45 eV, less than 0.4 eV, or less than 0.35 eV according to embodiments. Moreover, the metal-and-halogen-containing precursor may have not been excited in any remote plasma prior to entering the substrate processing region in embodiments. For example, if a remote plasma region or a separate chamber region is present and used to conduct the halogen-containing precursor toward the substrate processing region, the separate chamber region or remote plasma region may be plasma-free as defined herein. Etch processes 101 and 201 may contain at least two repetitions of operations 120-150 or 220-250, respectively, in embodiments.

The substrate processing region and any remote regions which pass the metal-and-halogen-containing precursors may be "hydrogen-free" according to embodiments. Hydrogen and O—H groups, in embodiments, may actually end up adding material to metals and metal nitrides such that the etch process does not proceed at a desirable rate. The metal film or the metal nitride film may actually become thicker instead of thinner in embodiments. In any event, a presence of hydrogen in the substrate processing region may therefore reduce the effective etch selectivity. As such, the metal-and-halogen-containing precursor may be fluorine-free in embodiments.

In all embodiments described herein, the metal-and-halogen-containing precursor (e.g. $WCl_6$) is supplied at a flow rate of between 5 sccm and 500 sccm, between 10 sccm and 300 sccm, between 25 sccm and 200 sccm, between 50 sccm and 150 sccm or between 75 sccm and 125 sccm. The oxygen-containing precursor (e.g. $O_2$ or $O_3$) is supplied at a flow rate of between 5 sccm and 2,000 sccm, between 10 sccm and 1,000 sccm, between 25 sccm and 700 sccm, between 50 sccm and 500 sccm or between 100 sccm and 300 sccm in any of the embodiments described herein.

The reactions may proceed thermally, excited only by the temperature of the substrate itself, according to embodiments. In embodiments which rely on the temperature of the substrate to effect the etching reaction, the term "plasma-free" may be used herein to describe the substrate processing region during application using no or essentially no plasma power. The plasma power may also be kept below small threshold amounts to enable the appropriate reactions to proceed. The plasma power applied to the substrate processing region may be less than 100 watts, less than 50 watts, less than 30 watts, less than 10 watts and may be 0 watts in embodiments. The process pressures described next apply to all the embodiments herein. The pressure within the substrate processing region may be between 0.1 Torr and 50 Torr, between 0.2 Torr and 30 Torr, between 0.5 Torr and 20 Torr, between 1 Torr and 10 Torr in embodiments.

Each of the embodiments described herein possess purging operations which may occur after the patterned substrate is exposed to the oxygen-containing precursor and after the patterned substrate is exposed to the metal-and-halogen-containing precursor. Generally speaking, the etching operations of all processes described herein may instead simply have a stoppage in the flow of precursors into the substrate processing region during the processes disclosed and claimed herein. Alternatively, as in the examples, the substrate processing region may be actively purged using a gas which displays essentially no chemical reactivity to the exposed materials on the patterned substrate. After the precursor stoppage or the active purging, the next precursor may be flowed into the substrate processing region to begin the the oxidation or the removal of the oxidation layer from the patterned substrate.

Generally speaking, the processes described herein may be used to etch metals and metal nitrides. A metal may comprise or consist of a "metal element" which forms a conducting material in a solid consisting only of that metal element. The conducting material consisting only of the one metal element (or the metal in relatively pure form) may have a conductivity less than 10-5 Ω-m at 20° C. in embodiments. The conducting material may form ohmic contacts when joined with another conducting material according to embodiments. A metal nitride may comprise a metal element and nitrogen and may consist of a metal element and nitrogen in embodiments. In the exemplary case of tungsten and tungsten nitride, the metal may comprise or consist of tungsten and the metal nitride may comprise or consist of tungsten and nitrogen. The metal nitride may be either conducting or insulating in embodiments.

An advantage and benefit of the processes described herein lies in the conformal rate of removal of metals and metal nitrides from the substrate. The methods involve a conformal oxidation operation preceding exposure to a metal-nitride precursor which removes only the evenly oxidized portion of the metal or metal nitride. As used herein, a conformal etch process refers to a generally uniform removal rate of material from a patterned surface regardless of the shape of the surface. The surface of the layer before and after the etch process are generally parallel. A person having ordinary skill in the art will recognize that the etch process likely cannot be 100% conformal and thus the term "generally" allows for acceptable tolerances. Similarly, a conformal layer refers to a layer having generally uniform thickness. A conformal layer may have an outer surface in the same shape as the inner surface, i.e., the outer surface and the inner surface are generally parallel.

The flow of precursors into the substrate processing region may further include one or more relatively inert gases such as He, $N_2$, Ar. The inert gas may be included, for example, to improve process uniformity. Process uniformity is generally increased when helium is included. These additives are present in embodiments throughout this specification. Flow rates and ratios of the different gases may be used to control etch rates and etch selectivity.

Figure 3A:
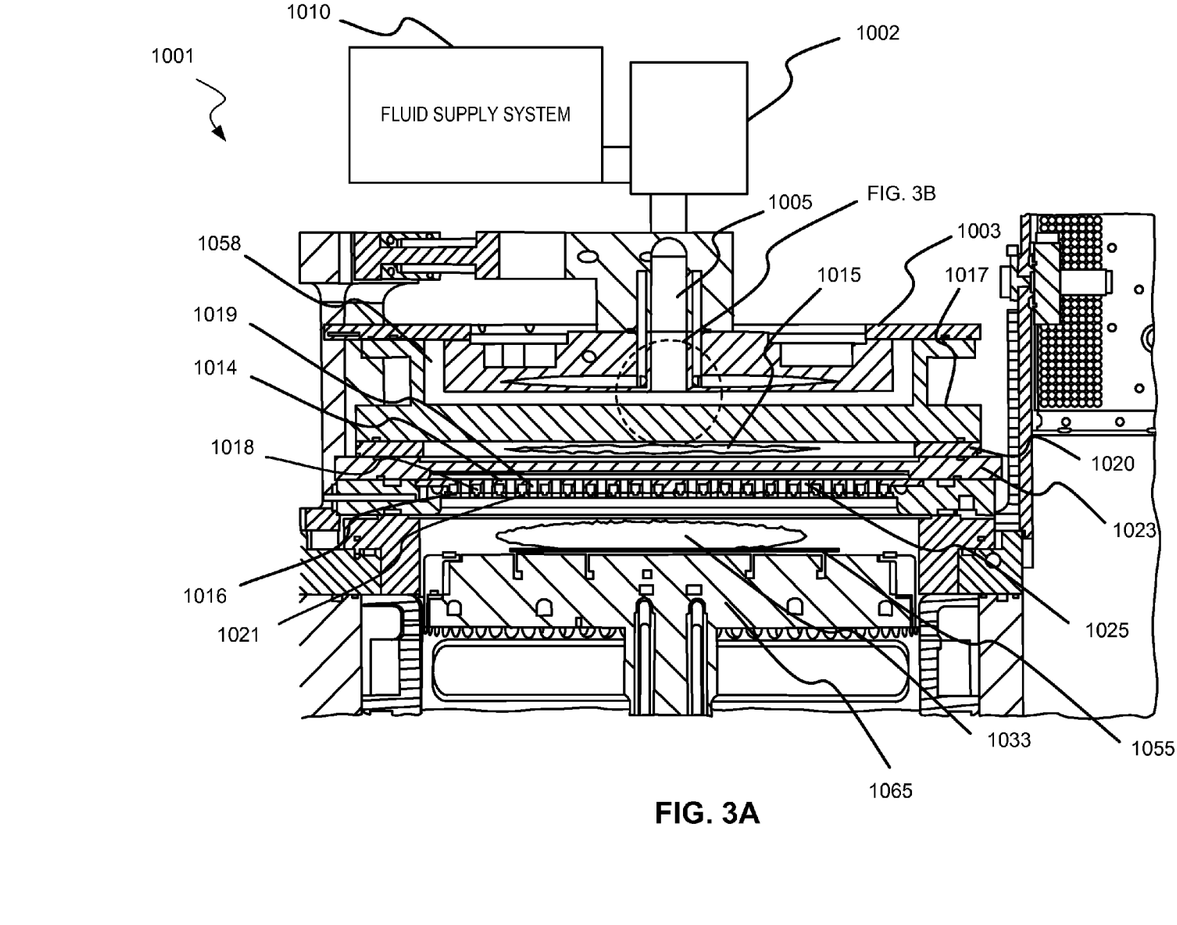
FIG. 3A shows a schematic cross-sectional view of a substrate processing chamber according to embodiments.

FIG. 3A shows a cross-sectional view of an exemplary substrate processing chamber 1001 with a partitioned plasma generation region within the processing chamber. During the ensuing discussion, it will be understood that the plasma generation region may have little or no plasma power applied during the etch processes described herein according to embodiments. During layer etching, a process gas may be flowed into chamber plasma region 1015 through a gas inlet assembly 1005. A remote plasma system (RPS) 1002 may optionally be included in the system, and may process a first gas which then travels through gas inlet assembly 1005. The process gas may be excited within RPS 1002 prior to entering chamber plasma region 1015. The oxygen-containing may be excited in RPS 1002 and/or in the chamber plasma region 1015 but may be unexcited in any plasma prior to reacting with substrate 1055. Accordingly, the oxygen-containing precursor as discussed above, for example, may pass through RPS 1002 or bypass the RPS unit in embodiments. The metal-halide precursor may pass through RPS 1002 or bypass the RPS unit in embodiments and is not excited in any plasma prior to reacting with substrate 1055.

A cooling plate 1003, faceplate 1017, ion suppressor 1023, showerhead 1025, and a substrate support 1065 (also known as a pedestal), having a substrate 1055 disposed thereon, are shown and may each be included according to embodiments. Pedestal 1065 may have a heat exchange channel through which a heat exchange fluid flows to control the temperature of the substrate. This configuration may allow the substrate 1055 temperature to be cooled or heated to maintain relatively low temperatures, such as between −20° C. to 200° C. Pedestal 1065 may also be resistively heated to relatively high temperatures, such as between 100° C. and 1100° C., using an embedded heater element.

Exemplary configurations may include having the gas inlet assembly 1005 open into a gas supply region 1058 partitioned from the chamber plasma region 1015 by faceplate 1017 so that the gases/species flow through the holes in the faceplate 1017 into the chamber plasma region 1015. Structural and operational features may be selected to prevent significant backflow of plasma from the chamber plasma region 1015 back into the supply region 1058, gas inlet assembly 1005, and fluid supply system 1010. The structural features may include the selection of dimensions and cross-sectional geometries of the apertures in faceplate 1017 to deactivate back-streaming plasma. The operational features may include maintaining a pressure difference between the gas supply region 1058 and chamber plasma region 1015 that maintains a unidirectional flow of plasma through the showerhead 1025. The faceplate 1017, or a conductive top portion of the chamber, and showerhead 1025 are shown with an insulating ring 1020 located between the features, which allows an AC potential to be applied to the faceplate 1017 relative to showerhead 1025 and/or ion suppressor 1023. The insulating ring 1020 may be positioned between the faceplate 1017 and the showerhead 1025 and/or ion suppressor 1023 enabling a capacitively coupled plasma (CCP) to be formed in the first plasma region.

The plurality of holes in the ion suppressor 1023 may be configured to control the passage of the activated gas, i.e., the ionic, radical, and/or neutral species, through the ion suppressor 1023. For example, the aspect ratio of the holes, or the hole diameter to length, and/or the geometry of the holes may be controlled so that the flow of ionically-charged species in the activated gas passing through the ion suppressor 1023 is reduced. The holes in the ion suppressor 1023 may include a tapered portion that faces chamber plasma region 1015, and a cylindrical portion that faces the showerhead 1025. The cylindrical portion may be shaped and dimensioned to control the flow of ionic species passing to the showerhead 1025. An adjustable electrical bias may also be applied to the ion suppressor 1023 as an additional means to control the flow of ionic species through the suppressor. The ion suppression element 1023 may function to reduce or eliminate the amount of ionically charged species traveling from the plasma generation region to the substrate. Uncharged neutral and radical species may still pass through the openings in the ion suppressor to react with the substrate.

Plasma power can be of a variety of frequencies or a combination of multiple frequencies. In the exemplary processing system the plasma may be provided by RF power delivered to faceplate 1017 relative to ion suppressor 1023 and/or showerhead 1025. The RF power may be between about 10 watts and about 5000 watts, between about 100 watts and about 2000 watts, between about 200 watts and about 1500 watts, or between about 200 watts and about 1000 watts in embodiments. The RF frequency applied in the exemplary processing system may be low RF frequencies less than about 200 kHz, high RF frequencies between about 10 MHz and about 15 MHz, or microwave frequencies greater than or about 1 GHz in embodiments. The plasma power may be capacitively-coupled (CCP) or inductively-coupled (ICP) into the remote plasma region.

A precursor, for example the oxygen-containing precursor, may be flowed into substrate processing region 1033 by embodiments of the showerhead described herein. Excited species derived from the process gas in chamber plasma region 1015 may travel through apertures in the ion suppressor 1023, and/or showerhead 1025 and react with an additional precursor flowing into substrate processing region 1033 from a separate portion of the showerhead. Alternatively, if all precursor species are being excited in chamber plasma region 1015, no additional precursors may be flowed through the separate portion of the showerhead. A local plasma may, alternatively or in combination, be present in substrate processing region 1033 during the selective etch process. While a plasma may be generated in substrate processing region 1033, a plasma may alternatively not be generated in substrate processing region 1033. Excited derivatives of the precursors may be created or enter the region above the substrate to etch structures or remove species from the substrate.

Figure 3B:
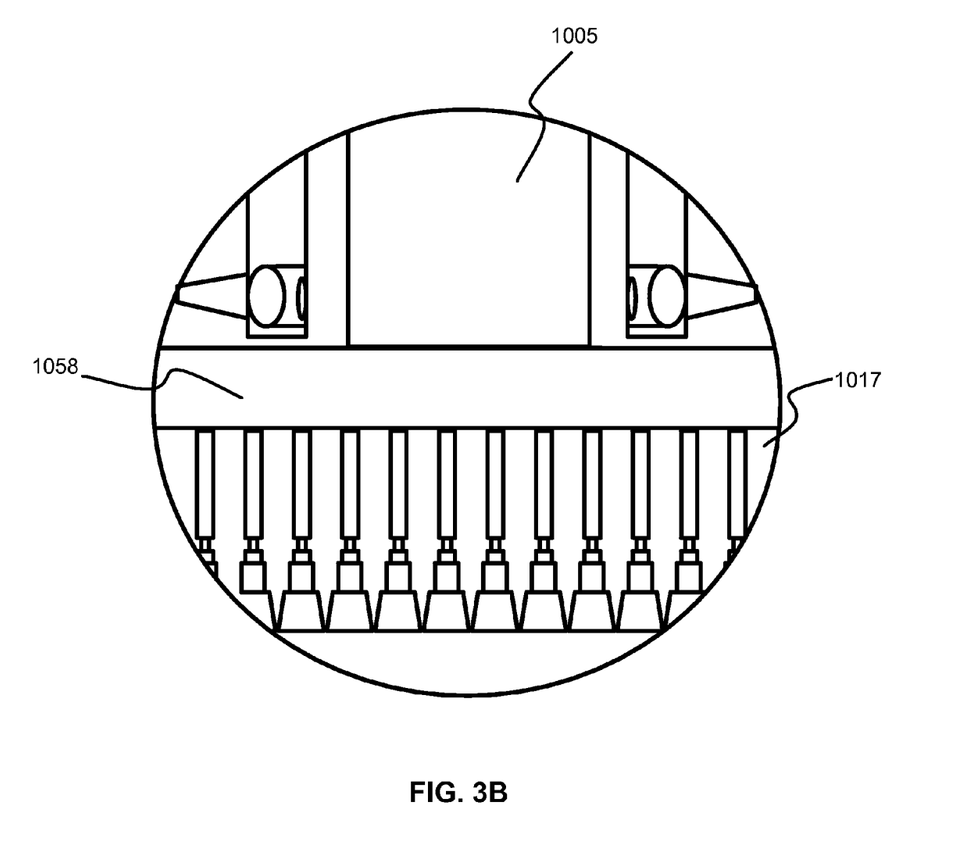
FIG. 3B shows a schematic cross-sectional view of a portion of a substrate processing chamber according to embodiments.

FIG. 3B shows a detailed view of the features affecting the processing gas distribution through faceplate 1017. The gas distribution assemblies such as showerhead 1025 for use in the processing chamber section 1001 may be referred to as dual channel showerheads (DCSH) and are additionally detailed in the embodiments described in FIG. 3A as well as FIG. 3C herein. The dual channel showerhead may provide for etching processes that allow for separation of etchants outside of the processing region 1033 to provide limited interaction with chamber components and each other prior to being delivered into the processing region.

The showerhead 1025 may comprise an upper plate 1014 and a lower plate 1016. The plates may be coupled with one another to define a volume 1018 between the plates. The coupling of the plates may be so as to provide first fluid channels 1019 through the upper and lower plates, and second fluid channels 1021 through the lower plate 1016. The formed channels may be configured to provide fluid access from the volume 1018 through the lower plate 1016 via second fluid channels 1021 alone, and the first fluid channels 1019 may be fluidly isolated from the volume 1018 between the plates and the second fluid channels 1021. The volume 1018 may be fluidly accessible through a side of the gas distribution assembly 1025. Although the exemplary system of FIGS. 3A-3C includes a dual-channel showerhead, it is understood that alternative distribution assemblies may be utilized that maintain first and second precursors fluidly isolated prior to substrate processing region 1033. For example, a perforated plate and tubes underneath the plate may be utilized, although other configurations may operate with reduced efficiency or not provide as uniform processing as the dual-channel showerhead as described.

Figure 3C:
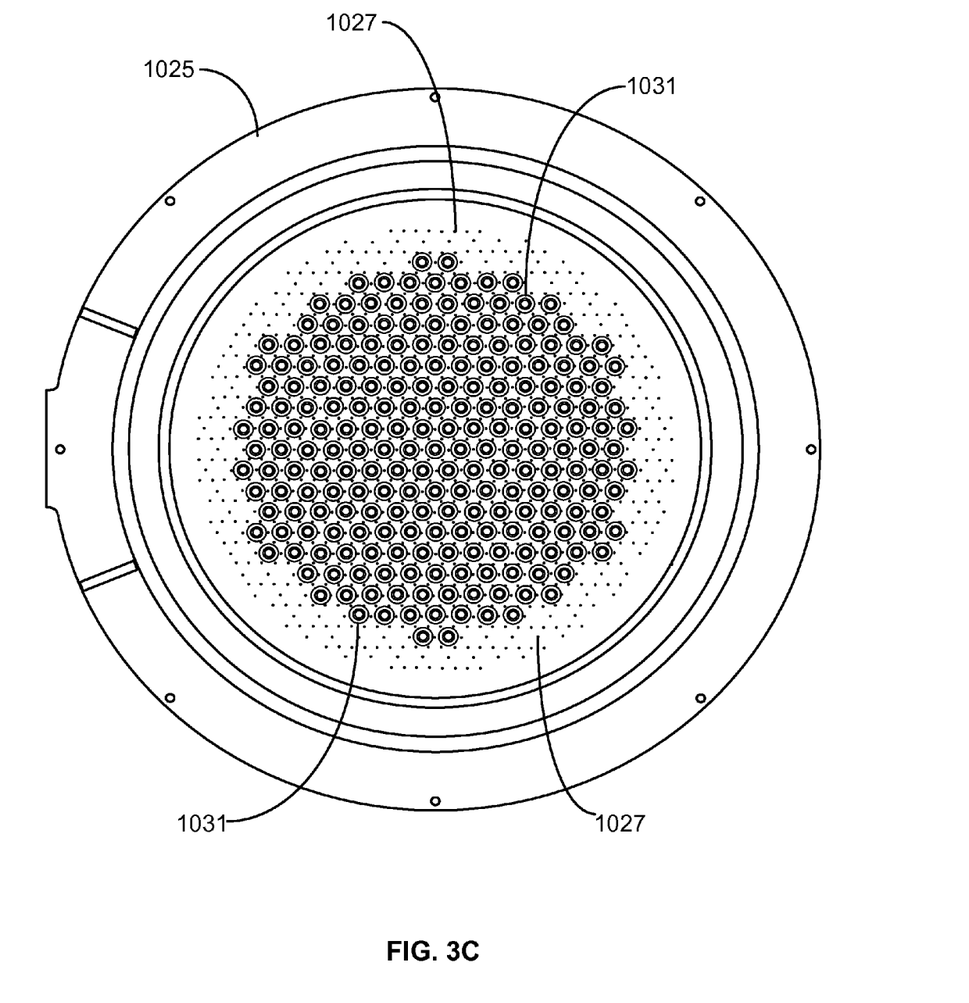
FIG. 3C shows a bottom view of a showerhead according to embodiments.

FIG. 3C is a bottom view of a showerhead 1025 for use with a processing chamber in embodiments. Showerhead 1025 corresponds with the showerhead shown in FIG. 3A. Through-holes 1031, which show a view of first fluid channels 1019, may have a plurality of shapes and configurations to control and affect the flow of precursors through the showerhead 1025. Small holes 1027, which show a view of second fluid channels 1021, may be distributed substantially evenly over the surface of the showerhead, even amongst the through-holes 1031, which may help to provide more even mixing of the precursors as they exit the showerhead than other configurations.

Figure 4:
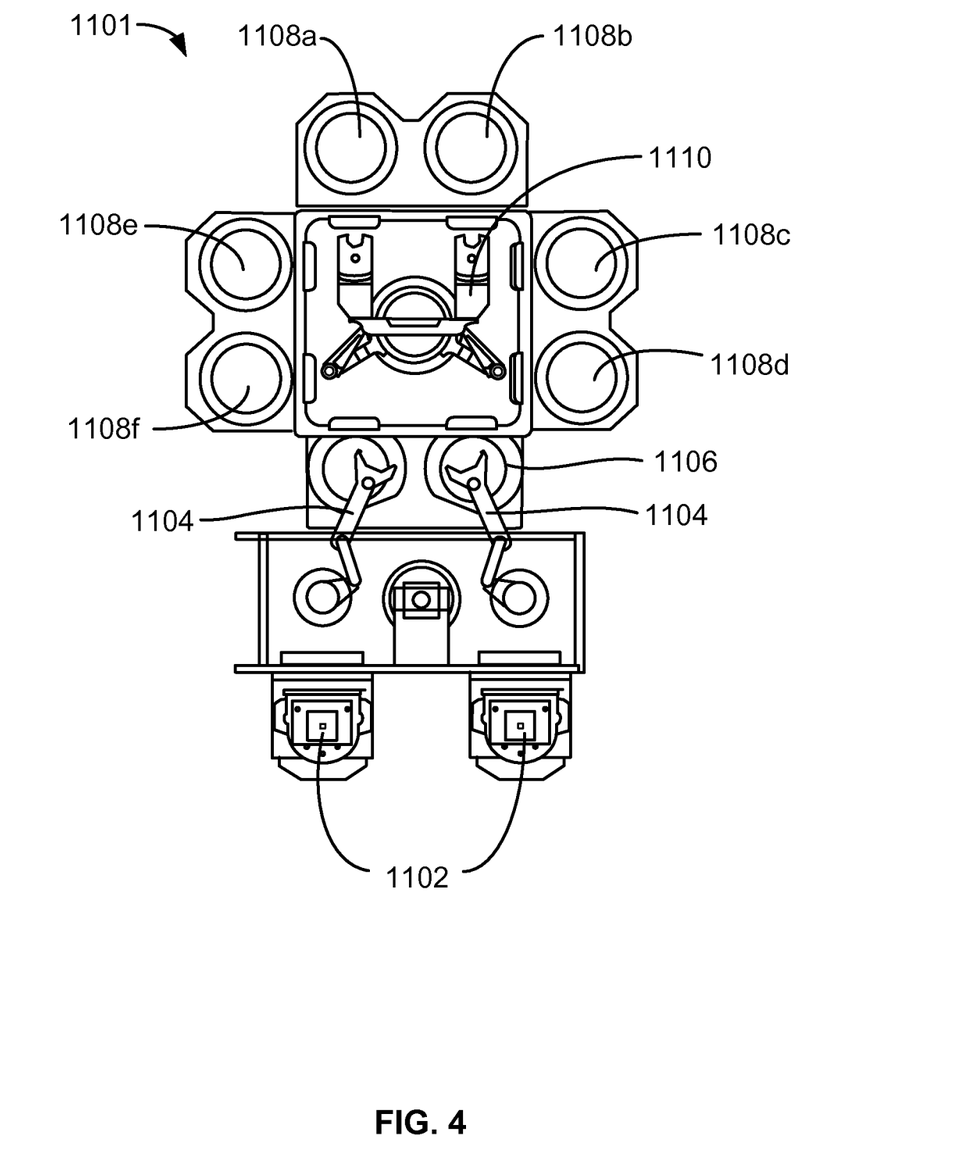
FIG. 4 shows a top view of an exemplary substrate processing system according to embodiments.

Embodiments of the substrate processing chambers may be incorporated into larger fabrication systems for producing integrated circuit chips. FIG. 4 shows one such processing system (mainframe) 1101 of deposition, etching, baking, and curing chambers in embodiments. In the figure, a pair of front opening unified pods (load lock chambers 1102) supply substrates of a variety of sizes that are received by robotic arms 1104 and placed into a low pressure holding area 1106 before being placed into one of the substrate processing chambers 1108a-f. A second robotic arm 1110 may be used to transport the substrate wafers from the holding area 1106 to the substrate processing chambers 1108a-f and back. Each substrate processing chamber 1108a-f, can be outfitted to perform a number of substrate processing operations including the dry etch processes described herein in addition to cyclical layer deposition (CLD), atomic layer deposition (ALD), chemical vapor deposition (CVD), physical vapor deposition (PVD), etch, pre-clean, degas, orientation, and other substrate processes.

As used herein "substrate" may be a support substrate with or without layers formed thereon. The patterned substrate may be an insulator or a semiconductor of a variety of doping concentrations and profiles and may, for example, be a semiconductor substrate of the type used in the manufacture of integrated circuits. Exposed "metal" of the patterned substrate is predominantly a metal element but may include minority concentrations of other elemental constituents such as nitrogen, oxygen, hydrogen, silicon and carbon. Exposed "metal" may consist of or consist essentially of a metal element. Exposed "metal nitride" of the patterned substrate is predominantly nitrogen and a metal element but may include minority concentrations of other elemental constituents such as oxygen, hydrogen, silicon and carbon. Exposed "metal nitride" may consist of or consist essentially of nitrogen and a metal element. Exposed "silicon" or "polysilicon" of the patterned substrate is predominantly Si but may include minority concentrations of other elemental constituents such as nitrogen, oxygen, hydrogen and carbon. Exposed "silicon" or "polysilicon" may consist of or consist essentially of silicon. Exposed "silicon nitride" of the patterned substrate is predominantly silicon and nitrogen but may include minority concentrations of other elemental constituents such as oxygen, hydrogen and carbon. "Exposed silicon nitride" may consist essentially of or consist of silicon and nitrogen. Exposed "silicon oxide" of the patterned substrate is predominantly $SiO_2$ but may include minority concentrations of other elemental constituents (e.g. nitrogen, hydrogen, carbon). In some embodiments, silicon oxide regions etched using the methods disclosed herein consist essentially of silicon and oxygen.

The term "precursor" is used to refer to any process gas which takes part in a reaction to either remove material from or deposit material onto a surface. "Plasma effluents"

describe gas exiting from the chamber plasma region and entering the substrate processing region. Plasma effluents are in an "excited state" wherein at least some of the gas molecules are in vibrationally-excited, dissociated and/or ionized states. A "radical precursor" is used to describe plasma effluents (a gas in an excited state which is exiting a plasma) which participate in a reaction to either remove material from or deposit material on a surface. "Radical-oxygen" are radical precursors which contain oxygen but may contain other elemental constituents. The phrase "inert gas" refers to any gas which does not form chemical bonds when etching or being incorporated into a layer. Exemplary inert gases include noble gases but may include other gases so long as no chemical bonds are formed when (typically) trace amounts are trapped in a layer.

A gap is an etched geometry having any horizontal aspect ratio. Viewed from above the surface, gaps may appear circular, oval, polygonal, rectangular, or a variety of other shapes. A "trench" is a long gap. A trench may be in the shape of a moat around an island of material whose aspect ratio is the length or circumference of the moat divided by the width of the moat. A "via" is a short gap with horizontal aspect ratio, as viewed from above, near unity. A via may appear circular, slightly oval, polygonal or slightly rectangular. A via may or may not be filled with metal to form a vertical electrical connection.

Having disclosed several embodiments, it will be recognized by those of skill in the art that various modifications, alternative constructions, and equivalents may be used without departing from the spirit of the disclosed embodiments. Additionally, a number of well known processes and elements have not been described to avoid unnecessarily obscuring the disclosed embodiments. Accordingly, the above description should not be taken as limiting the scope of the claims.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the disclosed embodiments, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a process" includes a plurality of such processes and reference to "the dielectric material" includes reference to one or more dielectric materials and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

The invention claimed is:

1. A method of etching a metal layer, the method comprising:
   placing a patterned substrate into a substrate processing region of a substrate processing chamber, wherein the patterned substrate comprises an exposed portion of the metal layer, wherein the metal layer comprises a first metal element; and
   flowing an oxygen-containing precursor into the substrate processing region;
   oxidizing the exposed portion of the metal layer, wherein oxidizing the exposed portion forms an oxidized portion of the metal layer and leaves behind an unoxidized portion of the metal layer; and
   flowing a metal-and-halogen-containing precursor into the substrate processing region;
   selectively etching the oxidized portion of the metal layer, wherein the metal-and-halogen-containing precursor comprises a second metal element and a halogen.

2. The method of claim 1 wherein the metal layer consists of the first metal element and the first metal element is one of titanium, hafnium, zirconium, vanadium, niobium, tantalum, chromium, molybdenum, tungsten, manganese, rhenium, technetium, iron, aluminum, gallium.

3. A method of etching a metal-and-nitrogen-containing layer, the method comprising:
   placing a patterned substrate into a substrate processing region of a substrate processing chamber, wherein the patterned substrate comprises an exposed portion of the metal-and-nitrogen-containing layer, wherein the metal layer comprises a first metal element and nitrogen; and
   flowing an oxygen-containing precursor into the substrate processing region;
   oxidizing the exposed portion of the metal-and-nitrogen-containing layer, wherein oxidizing the exposed portion produces an oxidized portion of the metal-and-nitrogen-containing layer and leaves behind an unoxidized portion of the metal-and-nitrogen-containing layer; and
   flowing a metal-and-halogen-containing precursor into the substrate processing region;
   selectively etching the oxidized portion of the metal-and-nitrogen-containing layer, wherein the metal-and-halogen-containing precursor comprises a second metal element and a halogen.

4. A method of etching a metal-containing layer, the method comprising:
   placing a patterned substrate into a substrate processing region of a substrate processing chamber, wherein the patterned substrate comprises an exposed portion of the metal-containing layer as well as exposed regions of a silicon-containing material, wherein the metal-containing layer comprises a first metal element; and
   removing a cycle thickness of the metal-containing layer with a processing cycle of:
   i) flowing an oxygen-containing precursor into the substrate processing region, oxidizing the exposed portion of the metal-containing layer, wherein oxidizing the exposed portion creates an oxidized portion of the metal-containing layer but leaves behind an unoxidized portion of the metal-containing layer; and
   ii) flowing a metal-and-halogen-containing precursor into the substrate processing region, removing the oxidized portion of the metal-containing layer and leaving the remaining portion of the metal-containing layer intact, wherein the metal-and-halogen-containing precursor comprises a second metal element and a halogen.

5. The method of claim 4 wherein the operation of removing the oxidized portion of the metal-containing layer etches the oxidized portion of the metal-containing layer at over one hundred times as fast as the operation etches the unoxidized portion.

6. The method of claim 4 wherein operations i) and ii) are repeated N times to remove a thickness of (N+1) times the cycle thickness.

7. The method of claim 4 wherein the substrate processing region is plasma-free during the operation of flowing the metal-and-halogen-containing precursor into the substrate processing region.

8. The method of claim 4 wherein the metal-containing layer consists only of the first metal element.

9. The method of claim 4 wherein the metal-containing layer consists only of the first metal element and nitrogen.

10. The method of claim 4 wherein the oxygen-containing precursor comprises one of O, $O_2$, $O_3$, $N_2O$, $NO_2$, NO or $SO_3$.

11. The method of claim 4 wherein the first metal element has an atomic number of 22-24, 40-42, 72-73 or 74.

12. The method of claim 4 wherein the second metal element has an atomic number of 22-24, 40-42, 72-73 or 74.

13. The method of claim 4 wherein the metal-and-halogen-containing precursor consists only of the second metal element and the halogen.

14. The method of claim 4 wherein the halogen comprises one of Cl, F, Br or I.

15. The method of claim 4 wherein the silicon-containing material comprises one of silicon, polysilicon, silicon oxide, silicon germanium or silicon nitride.

* * * * *